(12) United States Patent
Uchioke et al.

(10) Patent No.: US 6,663,484 B2
(45) Date of Patent: Dec. 16, 2003

(54) AIR PRESSURE MANAGING SYSTEM FOR ELECTRONIC EQUIPMENT

(75) Inventors: Keizo Uchioke, Saitama (JP); Takao Miyazaki, Saitama (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/300,877

(22) Filed: Nov. 21, 2002

(65) Prior Publication Data

US 2003/0100257 A1 May 29, 2003

(30) Foreign Application Priority Data

Nov. 27, 2001 (JP) ........................................ 2001-360641

(51) Int. Cl.⁷ ................................................. H05K 5/00
(52) U.S. Cl. ..................................................... 454/184
(58) Field of Search ................................ 454/184, 187, 454/193, 239, 255

(56) References Cited

U.S. PATENT DOCUMENTS 5,056,331 A * 10/1991 Lotz ............................ 62/237
5,956,228 A * 9/1999 Zahorsky et al. ........... 361/695

FOREIGN PATENT DOCUMENTS

JP     2001-10166     1/2001

* cited by examiner

*Primary Examiner*—Derek Boles
(74) *Attorney, Agent, or Firm*—Sughrue Mion, PLLC

(57) ABSTRACT

A room has a door for closing a door opening in an openable manner. A thermal printer with electronic circuits is installed in the room. An air pressure managing system for the thermal printer includes a door state photo sensor for monitoring a state of the door, and outputs an open signal when the door is open. A dustproofing fan is actuated in response to outputting the open signal, for adjusting pressure of air in the thermal printer, to prevent the thermal printer from being influenced by air flowing from outside the door opening.

12 Claims, 5 Drawing Sheets

AIR PRESSURE MANAGING SYSTEM FOR ELECTRONIC EQUIPMENT

BACKGROUND OF THE INVENTION

1. Field of the Invention

The present invention relates to an air pressure managing system for an electronic equipment installed in a room having a door. More particularly, the present invention relates to an air pressure managing system for an electronic equipment installed in a room having a door, in which the electronic system can be managed with improved efficiency without harmful influence of much noise, or excessively high electric power.

2. Description Related to the Prior Art

There is a digital printing service in which a digital printer, for example thermal printer, is used in a room or a commercial space, for example in a convenience store or other shops. According to this, a memory card is used, in which digital image data is stored. The memory card is set in the digital printer. A display panel of the digital printer displays a command menu. A user or customer views the menu, and operate the digital printer to produce prints with image according to his or her digital image data.

Specifically at a convenience store as an environment with much pedestrian traffic of customers, there occurs external dust or particles entering the room at a considerable amount. It is very likely that dust comes to remain in the digital printer as electronic equipment that is installed in the room. If a shop owner or attendant fails to check and maintain the digital printer for a long time, the dust in the digital printer increases to a harmful extent. Image quality of prints may be lowered because the dust may cause failure or breakage of the digital printer. To solve such problems, there is a suggestion in JP-A 2001-010166 in that an external air sending fan is incorporated in the digital printer, sends air to the inside of the digital printer to heighten the air pressure inside the digital printer. Thus, entry of external dust is prevented in the digital printer.

However, there are excessive changes in the traffic of the customers between time zones during the business hour of the retail shop. If the external air sending fan is actuated incessantly to keep the air pressure high, the operation of the external air sending fan is ineffective typically in a time zone with very small traffic of customers. Noise in rotation of the external air sending fan may be heard in an unwanted manner. Electric power used in such a time zone may be too high.

SUMMARY OF THE INVENTION

In view of the foregoing problems, an object of the present invention is to provide an air pressure managing system for an electronic equipment installed in a room having a door, in which the electronic system can be managed with improved efficiency without harmful influence of much noise, or excessively high electric power.

In order to achieve the above and other objects and advantages of this invention, an air pressure managing system for an electronic equipment installed in a room having a door for closing a door opening in an openable manner is provided. A door state signal generator monitors a state of the door, and outputs an open signal when the door is open. An air pressure adjustor is actuated in response to outputting the open signal, for adjusting pressure of air in the equipment, to prevent the equipment from being influenced by air flowing from outside the door opening.

The air pressure adjustor prevents dust from spreading in the equipment, to keep an inside of the equipment clean, the dust having flowed with the air flowing from outside the door opening.

The air pressure adjustor is secured to the equipment, and the equipment is connected with the door state signal generator by a network.

Furthermore, a timer measures elapsed time elapsed after the air pressure adjustor stops. When the elapsed time comes up to a predetermined standby time, the air pressure adjustor operates for dust prevention in a standby sequence.

Furthermore, inner and outer opener switches or opener sensors detect an object or human body located respectively in front of and behind the door opening, to output a detection signal. A door driving mechanism is turned on when the detection signal is output, to open the door opening by moving the door in an open direction.

The air pressure adjustor includes a fan or blower for sending the air from outside the equipment toward an inside thereof.

The fan or blower, while the open signal is output, sends the air in a high level mode, and before start of outputting of the open signal and after discontinuation of outputting of the open signal, sends the air in a low level mode in which a flow rate of the air is smaller than in the high level mode.

While the fan or blower operates in the high level mode and when the door is closed, the door state signal generator discontinues outputting of the open signal. The timer measures elapsed time elapsed after discontinuation of the open signal. When the elapsed time comes up to a predetermined driving time, the fan or blower sends the air in the low level mode.

The fan or blower rotates at a lower rotational speed in the low level mode than in the high level mode.

According to another preferred embodiment, the air pressure adjustor, while the open signal is output, continuously operates for dust prevention, and before start of outputting of the open signal and after discontinuation of outputting of the open signal, intermittently operates for dust prevention.

While the air pressure adjustor operates and when the door is closed, the door state signal generator discontinues outputting of the open signal. The timer measures elapsed time elapsed after the outputting of the open signal discontinues. The air pressure adjustor, when the elapsed time comes up to a predetermined driving time, stops, and when the elapsed time subsequently comes up to a predetermined limit time, operates for dust prevention in a standby sequence.

The timer measures elapsed time elapsed while the air pressure adjustor operates in the standby sequence. When the elapsed time comes up to a predetermined operating time, the air pressure adjustor stops from operating.

The equipment is a printer.

The door state signal generator is a photo sensor.

In another aspect of the invention, an air pressure managing system includes a door state signal generator for monitoring a state of the door, and for outputting an open signal when the door is open. A protecting device is actuated in response to outputting the open signal, for protecting the equipment from being influenced externally through the door opening.

BRIEF DESCRIPTION OF THE DRAWINGS

The above objects and advantages of the present invention will become more apparent from the following detailed description when read in connection with the accompanying drawings, in which.

DETAILED DESCRIPTION OF THE PREFERRED EMBODIMENT(S) OF THE PRESENT INVENTION

Figure 1:
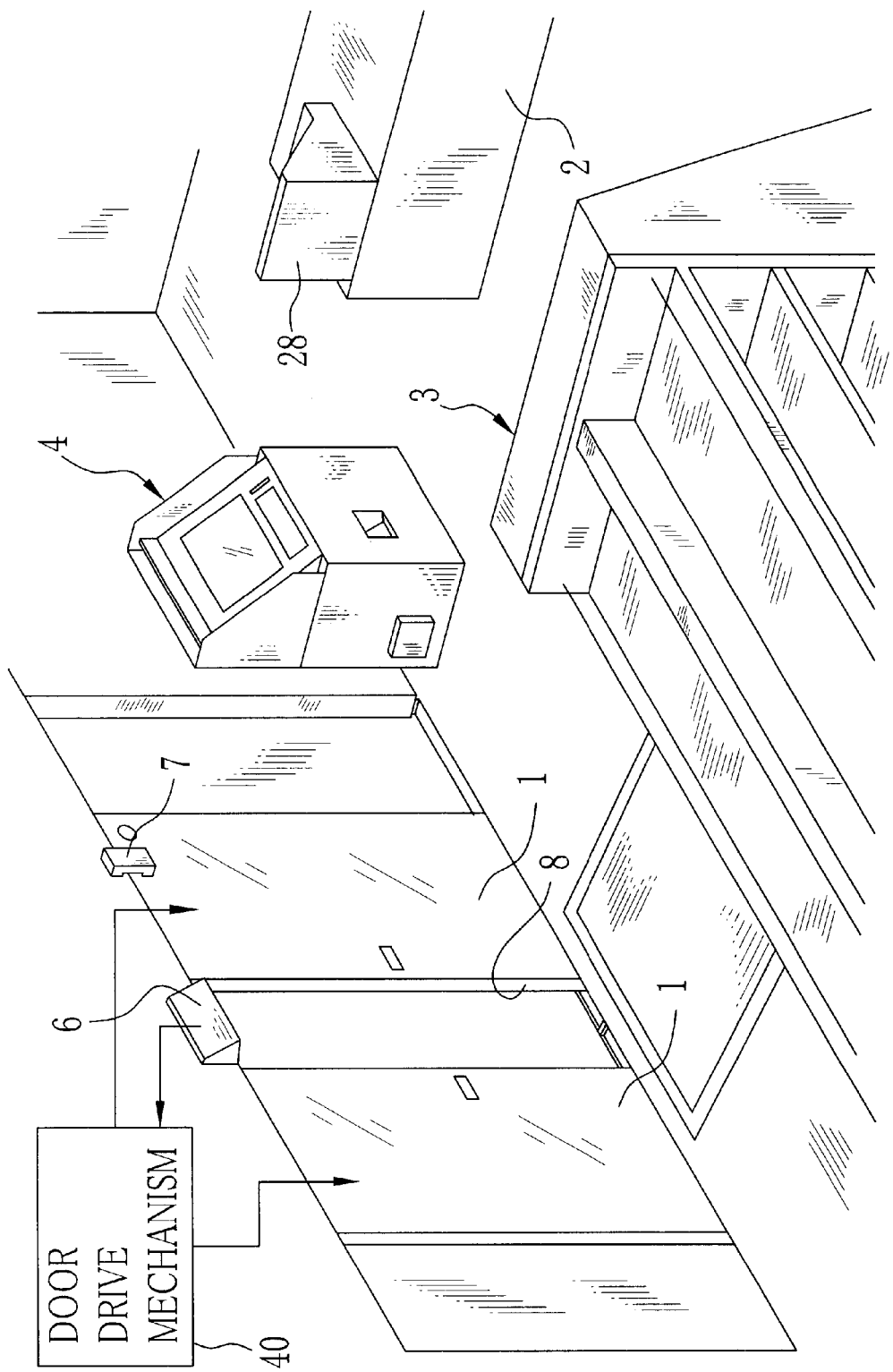
FIG. 1 is a perspective illustrating a room or shop in which a managing system for a thermal printer is used.

In FIG. 1, there are disposed a door 1 in an automatic door unit, a pulse counter 2, a commercial display case 3 and a thermal printer 4 as electronic equipment in a room that is a shop or store. Two photo sensors are disposed above the door 1, and include a door opener photo sensor 6 and a door state photo sensor 7 as a door state signal generator. When a human body of a customer is located in front of the door 1, the door opener photo sensor 6 detects the body. A door opening 8 is disposed behind the door 1. A door drive mechanism 40 drives the door 1. When the door opener photo sensor 6 detects the human body, a door motor in the door drive mechanism 40 is driven, so the door 1 opens and closes the door opening 8. The door state photo sensor 7 checks a state of being open or closed of the door 1, is connected with a network, such as a local area network (LAN), installed in the shop or store.

As it is not illustrated, there is a door opener photo sensor similar to the door opener photo sensor 6 and disposed outside the room. When detection of the human body at the door opener photo sensor 6 is discontinued, the door 1 starts returning to the closed position upon lapse of a predetermined short time.

It is also to be noted that the term of "door" herein is used to mean not only a door but also a window. The feature of the present invention is specifically effective for a window which is very frequently opened and closed.

Figure 2:
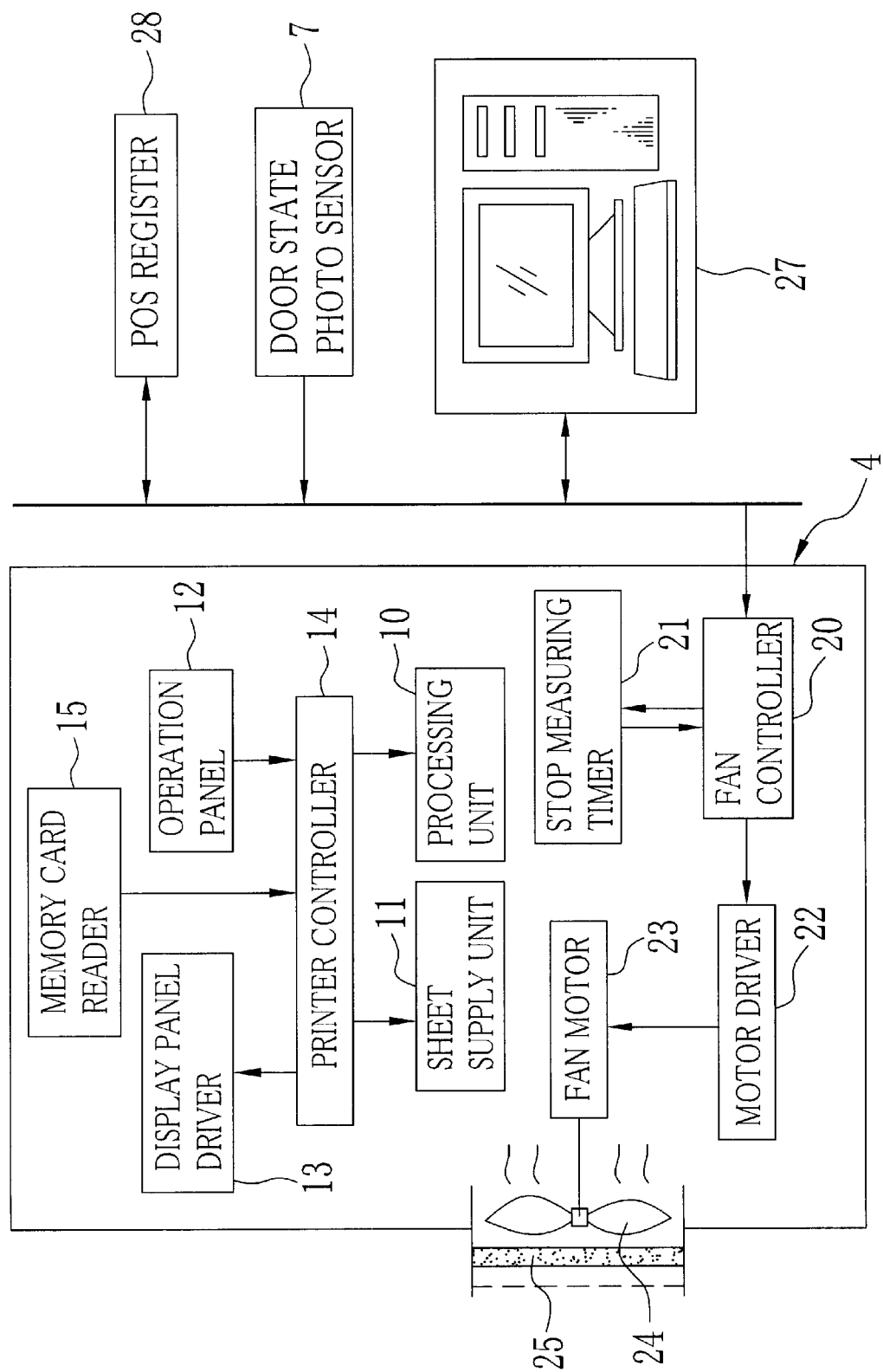
FIG. 2 is a block diagram illustrating a thermal printer together with a computer and other elements.

In FIG. 2, the thermal printer 4 includes a processing unit 10, a sheet supply unit 11, an operation panel 12 and a display panel driver 13. The processing unit 10 produces a print. The sheet supply unit 11 supplies the print to the processing unit 10. The operation panel 12 has a keyboard panel for example, is depressed or operated manually, to input signals. The display panel driver 13 is driven to indicate a process of operations of the CRT. A printer controller 14 controls various circuits in the thermal printer 4 according to command signals input by the operation panel 12. A memory card reader 15 reads digital image data from a memory card set in the thermal printer 4, and outputs the digital image data to the printer controller 14.

The thermal printer 4 includes a fan controller 20, a timer 21, a motor driver 22, a fan motor 23 and a dustproofing fan 24. The motor driver 22 receives a drive signal from the fan controller 20, and responsively supplies the fan motor 23 with power, to drive the fan 24. The fan 24 or blower operates as an air pressure adjustor. An air filter 25 is disposed in an intake port upstream from the fan 24. External air is taken in through the air filter 25, is filtrated to remove fine dust in rotation of the fan 24. The clean air is sent by the fan 24 to the inside of the thermal printer 4.

The timer 21 starts operation upon turning on of a power switch of the thermal printer 4. The fan controller 20 refers to a counted number of the timer 21, and monitors time of driving and stopping the fan 24.

A management computer 27, for example a personal computer, has a shop management program installed therein. A shop network, or LAN, is established by connection of the management computer 27 with the thermal printer 4, the door state photo sensor 7, and a POS (point-of-sale) cash register 28. The POS cash register 28 processes and records amounts of payment by sales of products. Also, the POS cash register 28 sends data to and receives data from the management computer 27 in relation to the sales amounts.

When it is detected that the door 1 comes to an open position, the door state photo sensor 7 outputs an open signal to the management computer 27. In response to this, the management computer 27 outputs a fan-starting signal, which is sent to the fan controller 20 by the network in the shop or store. When the door state photo sensor 7 detects that the door 1 comes to a closed position, the management computer 27 outputs a fan-stopping signal to the fan controller 20.

Figure 3:
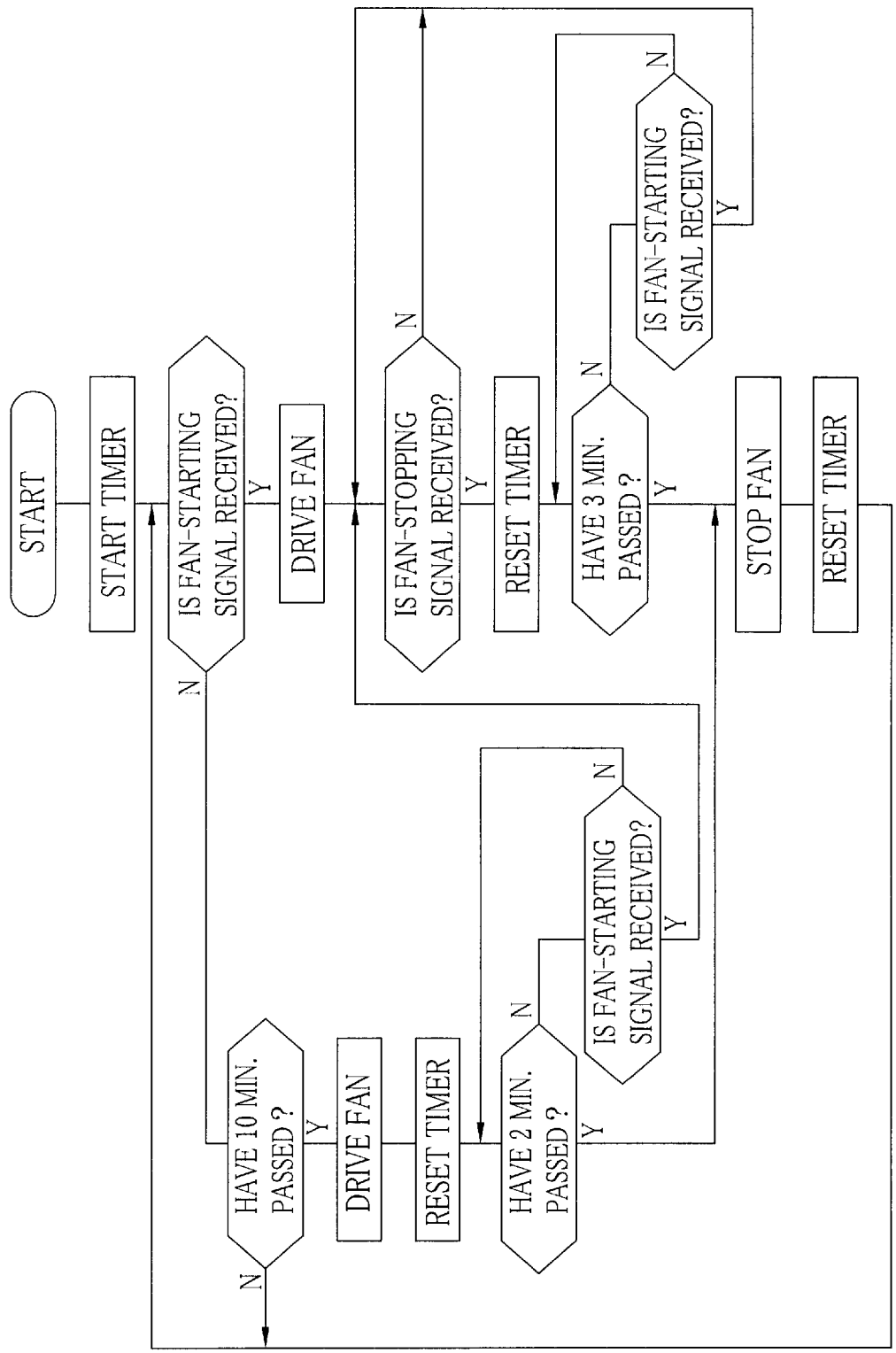
FIG. 3 is a flow chart illustrating the operation of the managing system.

The operation of the embodiment is described by referring to FIG. 3. When the thermal printer 4 is supplied with power initially, the timer 21 is operated. The fan controller 20 monitors the counted number or time in the timer 21, and at the same time, controls operation of the motor driver 22.

When a customer in front of the door 1 is detected by the door opener photo sensor 6, the door 1 is opened. The open state of the door 1 is detected by the door state photo sensor 7, which sends the open signal to the management computer 27. In response to the open signal, the management computer 27 sends the fan-starting signal to the fan controller 20.

When the fan controller 20 receives a fan-starting signal, the fan controller 20 sends a drive signal to the motor driver 22. The motor driver 22 supplies the fan motor 23 with power, to drive the fan 24. The fan 24 receives the external air filtrated by the air filter 25, and sends the same to the inside of the thermal printer 4 to raise an internal pressure of the thermal printer 4. The air taken in is discharged to a small extent through exit slits, gaps (not shown) or the like. The inner space of the thermal printer 4 is kept to have a high air pressure.

When the door 1 opens, fine dust or particles with air flow into the room through the door opening. Also, dust or particles inside the room are started floating by the air flow. There occurs floatation of considerable fine dust around the thermal printer 4. However, the fan 24 rotates to prevent such dust from entry into the thermal printer 4, because the internal air pressure of the thermal printer 4 is heightened by the fan 24.

When the door 1 is closed, the closing is detected by the door state photo sensor 7. The management computer 27 outputs a fan-stopping signal to the fan controller 20. When the fan controller 20 receives the fan-stopping signal, the fan controller 20 resets the counted number in the timer 21 to zero (0). The timer 21 starts counting again after being reset. The fan controller 20 refers to the counted number of the timer 21. When the counted number rises to a number corresponding to three minutes, the fan controller 20 outputs a stop signal to the motor driver 22. The fan 24 stops when three minutes have passed after the closing of the door 1. So the internal pressure of the thermal printer 4 is kept high for a sufficient time longer than time required for drop of the floating dust to the floor under gravity. If the door 1 is opened again within three minutes after the closing of the door 1, a fan-starting signal is sent to the fan controller 20. The fan 24 continues rotating.

When three minutes lapse after closing of the door 1, the fan controller 20 sends a stop signal to the motor driver 22. Supply of power to the fan motor 23 is discontinued. The fan 24 stops rotating. The internal air pressure becomes equal to the external air pressure. The fan controller 20 sends the stop signal to the motor driver 22, and at the same time, resets the timer 21.

Even while the fan 24 is stopped, the timer 21 continues measuring time. When the counted number comes up to a number corresponding to 10 minutes, then the fan controller 20 sends a drive signal to the motor driver 22, and resets the timer 21. The fan 24 is driven to cause air to flow in the thermal printer 4. Fine dust of a small amount having entered the thermal printer 4 during the stop of the fan 24 is ejected forcibly with the air to the outside of the thermal printer 4. The fan controller 20 refers to the counted number of the timer 21. When the counted number comes up to a number corresponding to two minutes, the fan controller 20 sends a stop signal to the motor driver 22. The rotations of the fan 24 are stopped. The timer 21 is reset.

If the door 1 becomes open before lapse of two minutes according to the measurement in the timer 21, the fan-starting signal is sent to the fan controller 20. The fan 24 continues rotating. The internal air pressure rises, so dust flowing from outside the room or shop will not enter the thermal printer 4. Now the fan controller 20 is in a state ready for outputting of the fan-stopping signal. The fan 24 continues rotating until lapse of three minutes after closing of the door 1.

If the door 1 opens and closes very frequently due to much traffic of customers, the fan 24 continues being driven. So no dust enters the thermal printer 4. In contrast, if the door 1 remains closed continuously, for example for several hours due to very little traffic, the fan 24 rotates for two minutes each time after 10 minutes have passed without opening/closing operation. The inside of the thermal printer 4 can be always free from dust.

Figure 4:
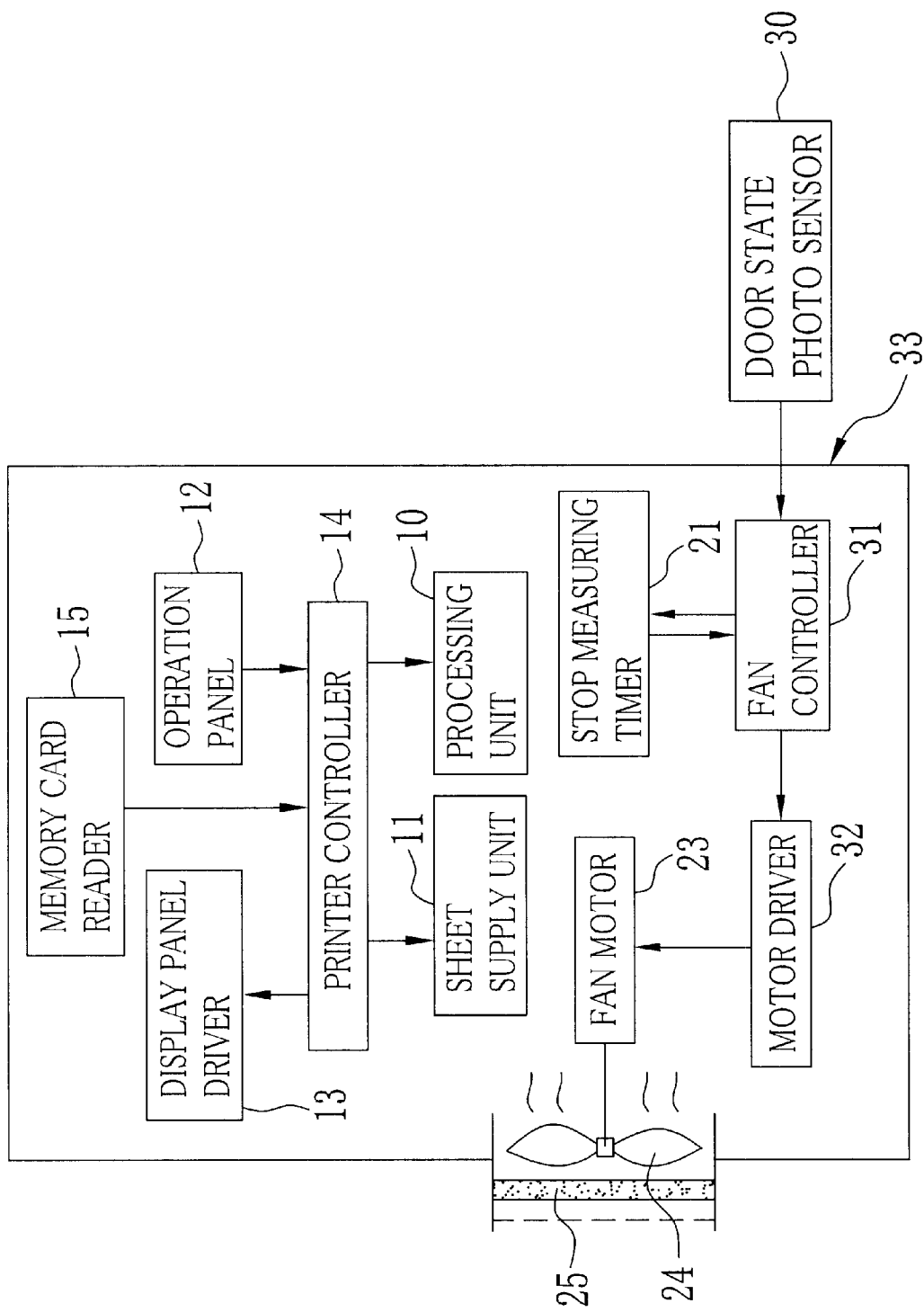
FIG. 4 is a block diagram illustrating a thermal printer according to a second preferred embodiment.

In FIG. 4, another preferred embodiment is illustrated. Elements similar to those in the above embodiment are designated with identical reference numerals. A door state photo sensor 30 as a door state signal generator is associated with the door 1. A fan controller 31 is connected with the door state photo sensor 30. The door state photo sensor 30, when the door 1 is closed, sends a closed signal to the fan controller 31, and when the door 1 is open, sends an open signal to the fan controller 31.

A motor driver 32 is connected with the fan controller 31. When a closed signal is input, the fan controller 31. sends a low power signal to the motor driver 32. When an open signal is input, the fan controller 31 sends a high power signal to the motor driver 32. The motor driver 32 supplies the fan motor 23 with power in response to the high or low power signal from the fan controller 31. When the high power signal is output, the power supplied to the fan motor 23 is higher than, for example, two times as high as that when the low power signal is output. The changes of the input to the fan motor 23 between the high and low power signals cause the rotation of the fan 24 to change between a high level mode and a low level mode. The timer 21 is started in response to a change in the output of the door state photo sensor 30 from the open signal to the closed signal, and measures the elapsed time after the closing of the door 1.

Figure 5:
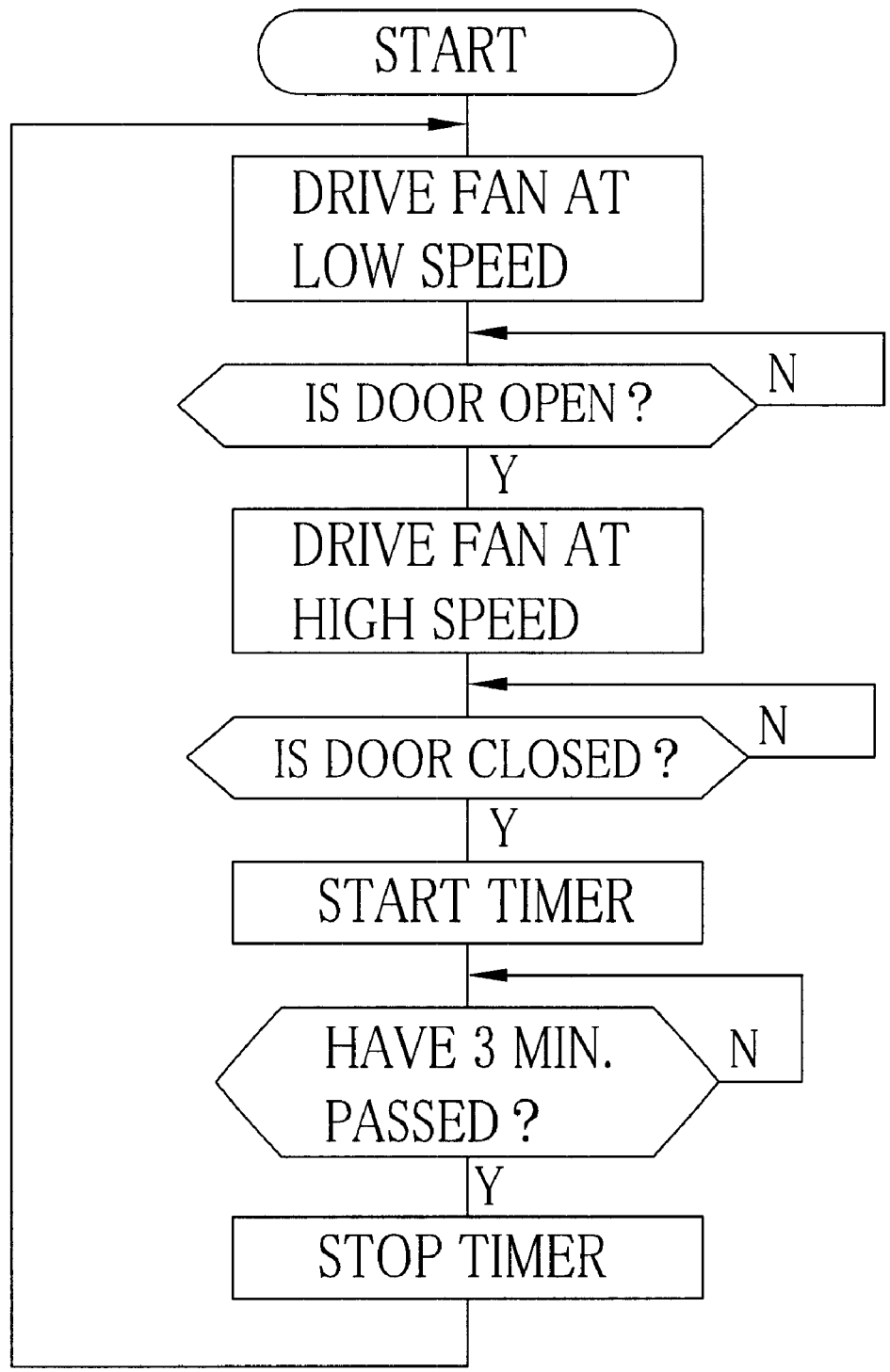
FIG. 5 is a flow chart illustrating the operation of the second preferred embodiment.

The operation of the embodiment is described with reference to FIG. 5. When a thermal printer 33 as electronic equipment is powered initially, the door state photo sensor 30 starts operation, to send a detection signal to the fan controller 31 to inform an open or closed state of the door 1. For example, the thermal printer 33 is started while the door 1 remains closed. A low power signal is sent by the fan controller 31 to the motor driver 32, to rotate the fan motor 23 at a low rotational speed. The fan 24 sends air at a comparably small flow rate. Internally remaining fine dust during the stop of the fan 24 is blown away toward the outside.

When the door 1 opens, the door state photo sensor 30 detects the open state. The fan controller 31 sends the high power signal to the motor driver 32. In response to this, the fan motor 23 is supplied with two times as high power, to rotate at a high speed. The fan 24 rotates fast, to send the air to the thermal printer 33 at a high flow rate, to raise an internal air pressure in the thermal printer 33. As the door 1 opens, fine dust floats around the thermal printer 33. However, the heightened pressure does not allow the floating dust to enter the thermal printer 33.

When the door 1 is closed, the closed signal is sent to the fan controller 31. At the same time, the timer 21 is triggered, to start measuring time. The fan controller 31 refers to the counted number in the timer 21. When the measured time in the timer 21 increases and comes up to a predetermined time, for example three minutes or five minutes, the fan controller 31 sends the low power signal to the motor driver 32. The fan 24 is changed over to the low level mode, to send air to cool the thermal printer 33.

In conclusion, rotation of the fan 24 can be changed over between low and high speeds according to respectively the closed and open states of the door 1. It is possible to drive the fan 24 efficiently for cases of much dust and little dust. It is to be noted that the fan 24 can be driven according to another preferred sequence, in which the fan 24 may be continuously driven when much dust occurs, and may be intermittently driven cyclically in active and inactive steps when little dust occurs.

Furthermore, driving at the low speed and the stop may be used in combination in a suitable manner instead of simply using the high level mode in driving the fan 24.

Note that the room or shop according to the present invention may be constituted by an individual building. However, the room or shop may be constituted by only a part of a larger building. A region lying outside the door 1 may be a corridor included in the building, an outdoor passage, an underground passage or the like. Furthermore, the room may be a specialized room such as a room in a factory, laboratory or the like instead of being a general purpose room.

In the above embodiments, the door 1 is constituted by the door unit of a two-wing type in which two wings are openable in right and left directions. However, the door 1 may be a single-wing type only having one openable wing. In the above embodiments, the door 1 is a sliding door. However, other types of doors may be used, including a swinging door, a rotary door, a foldable door, a bellows door, a combination door of plural structures and the like. Furthermore, the door 1 can have a tightly enclosing type with dustproofing edges. It is also possible in the invention to protect the thermal printer 4, 33 from harmful influence of the external environment, for example, humidity, pollution of the air, or the like.

Instead of the fan 24 or blower and the air filter 25 according to the above embodiments, it is possible in the invention to use an electrostatic air cleaner or other dustproofing devices. Furthermore, such dustproofing devices may be used in addition to the fan 24 in the above embodiments.

Furthermore, it is possible to use a separate unit of the fan 24 or blower, or a separate device for dustproofing or protection, and to connect to the outside of an air intake port of the thermal printer 4, 33.

In the above embodiments, the door opener photo sensor 6 for the door 1 is a photo sensor for photoelectrically detecting a human body or object. However, an opener sensor or switch for the door 1 may be a rubber mat switch, a touch sensor/switch, a pushbutton or other types.

In the above embodiments, the door state photo sensor 7, 30 may be replaced by a door state detecting switch for being turned on and off directly or indirectly by the movement of the door 1. Furthermore, the door opener photo sensor 6 for opening the door 1 may be used also as the door state photo sensor 7, 30. Also, circuits in the door drive mechanism 40 of the door 1 may be connected with the network.

In the above embodiments, the electronic equipment being managed is the thermal printer 4, 33. However, an equipment according to the invention may be any electronic equipments other than a printer, for example a terminal device, and also may be a controllable device that is not an electronic equipment.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. An air pressure managing system for an electronic equipment installed in a room having a door for closing a door opening in an openable manner, said air pressure managing system comprising:
    a door sensor for outputting an open signal when said door is open; and
    an air pressure adjustor for changing over from a first state to a second state in response to outputting of said open signal, and for setting higher a pressure of air in said electronic equipment when in said second state than when in said first state, so as to prevent air flowing through said door opening from entry into said electronic equipment.

2. An air pressure managing system as defined in claim 1, wherein said air pressure adjustor includes:
    a fan for sending said air into said electronic equipment; and
    a controller for changing over said fan between said first and second states.

3. An air pressure managing system as defined in claim 2, wherein said fan is secured to said electronic equipment.

4. An air pressure managing system as defined in claim 3, wherein said electronic equipment is connected with said door sensor by a network.

5. An air pressure managing system as defined in claim 3, further comprising a filter for removing dust from said air sent by said fan.

6. An air pressure managing system as defined in claim 5, further comprising a timer for time measurement, wherein said controller also sets said fan in said second state during a period which starts when said door is closed and which ends when said timer measures lapse of a predetermined shutting time with reference to said closing of said door without opening of said door.

7. An air pressure managing system as defined in claim 6, wherein when said timer measures lapse of a first predetermined time during which said fan is in said first state, said controller changes over said fan from said first state to said second state irrespective of closing of said door; and
    when said timer measures lapse of a second predetermined time during which said fan is in said second state, said controller changes over said fan from said second state to said first state.

8. An air pressure managing system as defined in claim 7, wherein said electronic equipment is a printer.

9. An air pressure managing system as defined in claim 8, wherein said fan is stopped when in said first state, and is rotated when in said second state.

10. An air pressure managing system as defined in claim 8, wherein said fan is rotated at a low speed when in said first state, and is rotated at a high speed higher than said low speed when in said second state.

11. An air pressure managing system as defined in claim 8, wherein said fan is rotated intermittently when in said first state, and is rotated continuously when in said second state.

12. An air pressure managing system as defined in claim 8, wherein said door sensor comprises a switch for detecting an access of an object to said door opening to output a detection signal, and said door opens in response to said detection signal.

* * * * *